United States Patent [19]
Curl

[11] 4,035,737
[45] July 12, 1977

[54] LOW NOISE AMPLIFIER

[76] Inventor: John J. Curl, c/o Ihem, 1820 Montreaux-Vaude, Switzerland

[21] Appl. No.: 664,108

[22] Filed: Mar. 5, 1976

Related U.S. Application Data

[63] Continuation of Ser. No. 499,608, Aug. 22, 1974, abandoned.

[51] Int. Cl.² .......................................... H03F 3/18
[52] U.S. Cl. ............................. 330/13; 179/1 A; 179/100.4 A; 330/15; 330/19
[58] Field of Search .......... 179/100.4 A, 100.41 M, 179/100.41 T, 1 A; 330/13, 15, 17, 18, 19

[56] References Cited

U.S. PATENT DOCUMENTS

| 3,418,590 | 12/1968 | Rongen et al. | 330/15 X |
| 3,500,221 | 3/1970 | Mercier | 330/22 X |

Primary Examiner—Rudolph V. Rolinec
Assistant Examiner—Lawrence J. Dahl
Attorney, Agent, or Firm—De Lio and Montgomery

[57] ABSTRACT

A low noise amplifier for amplifying a signal from a moving coil phono cartridge which comprises a plurality of pairs of complimentary first and second transistors in push-pull and each pair in parallel, with a resistance of relatively low-value in the emitter circuit of each transistor and all collectors connected to an output terminal.

2 Claims, 1 Drawing Figure

U.S. Patent July 12, 1977 4,035,737
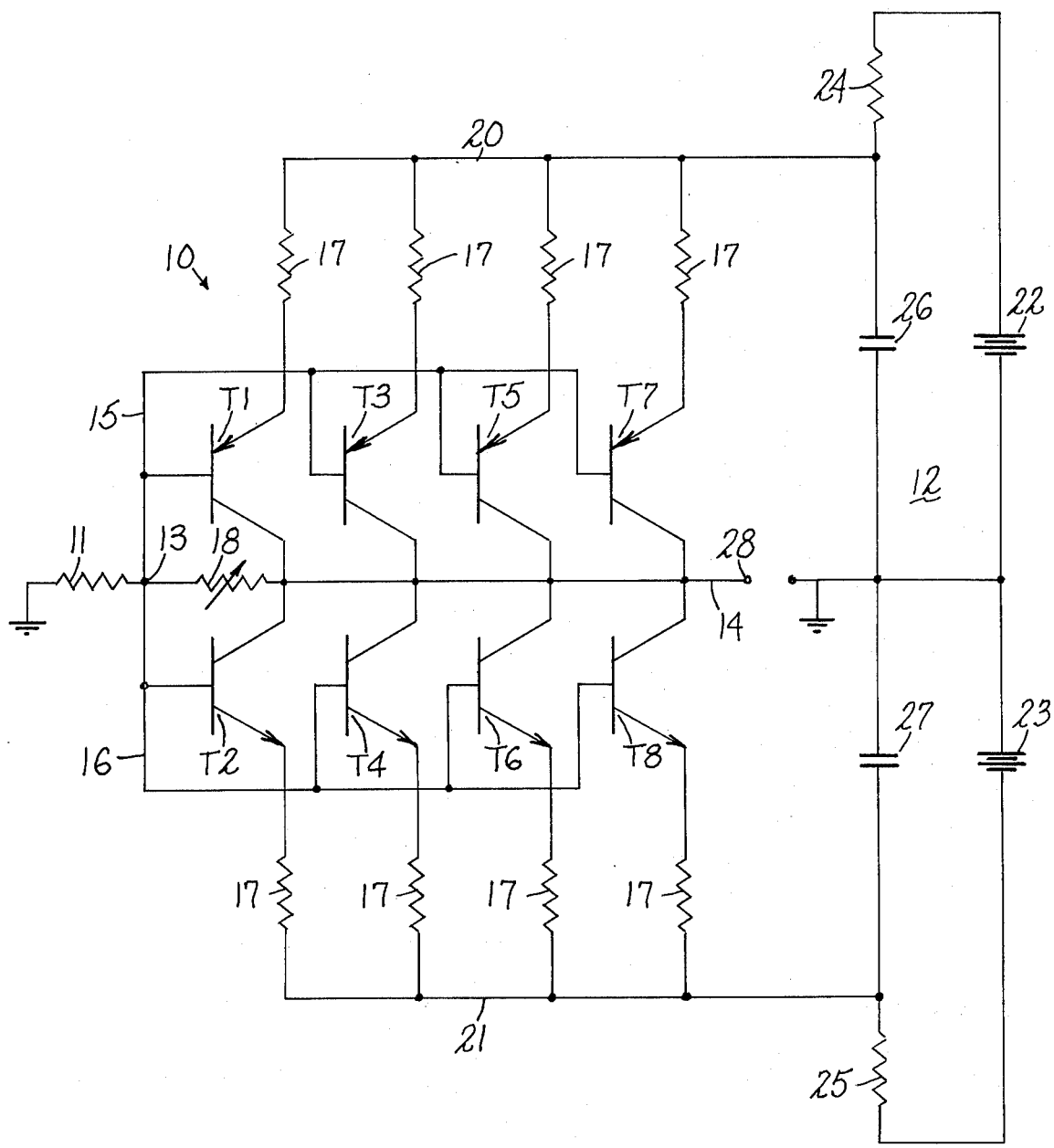

LOW NOISE AMPLIFIER

This is a continuation of application Ser. No. 499,608, filed Aug. 22, 1974 now abandoned.

This invention relates to amplifiers and more particularly relates to amplifiers adapted to receive an input from moving phono coil cartridges.

Moving coil cartridges of the type which includes a stylus which follows a groove in a record have been used for many years. However, its popularity has been limited because of its low output level and high cost. The cost factor is due to the need for a booster amplifier or step-up transformer to increase output to a usable level for audio-component or system use.

Transformers have been designed for this purpose, but the quality of the sound has not been high enough for more demanding listeners since such transformers inherently deteriorate the signal, particularly in the low frequency ranges.

Several booster emplifiers have been made and sold in an attempt to solve this problem; however, the available units suffer from excessive noise, hum pick-up, poor frequency response and high distortion.

In view of these deficiencies in known booster amplifiers and transformers used with moving coil cartridges, the present invention provides an amplifier which provides very little coloration of musical material and greatly reduces distortion and noise.

Briefly stated, the invention, in one form thereof, comprises a circuit utilizing a cartridge input to the bases of a plurality of parallel complimentary transistors arranged in a push-pull arrangement where the transistors are selected to have a low base resistance, and equal resistances are provided in the emitter circuit of each transistor to reduce undesirable inter actions. The basic push-pull configuration provides distortion cancelling affects. The input is to the bases of all transistors and the output is taken from a common collector terminal.

An object of this invention is to provide a new and improved amplifier for amplifying the output of a moving coil phono cartridge.

Another object of this invention is to provide such an amplifier greatly reduced distortion and noise.

The features of the invention which are believed to be novel are particularly pointed out and distinctly claimed in the concluding portion of this specification. The invention, however, both as to its organization and operation, together with further objects and advantages thereof may best be appreciated by reference to the following detailed description taken in conjunction with the drawings, wherein the single FIGURE of the drawing is a schematic diagram of an amplifier embodying the invention.

The amplifier 10 as shown in the drawing receives the output of a moving coil phono cartridge generally indicated by the reference numeral 11. The amplifier if supplied power from a power source generally indicated by the reference numeral 12. The output of cartridge 11 is applied to a terminal 13 and to the base electrodes of each of a pair of complimentary transistors T1, T2; T3, T4; T5, T6; T7, T8. Transistors T1, T3, T5 and T7 are of the PNP type which transistors T2, T4, T6 and T8 are of the NPN type. The collectors of each pair are commonly connected to an output line 14. The bases of all transistors are commonly connected to terminal 13. The bases of transistors T1, T3, T5 and T7 are connected to line 15 and, and the bases of T2, T4, T6 and T8 to line 16. The emitter circuit of each transistor includes a resistance 17. The values of all resistances 17 are the same. A feedback resistance 18 is connected between output line 14 and input terminal 13 and such resistance may be made variable.

The emitters of transistors T1, T3, T5 and T7 are connected to a common line 20 through their respective resistances 17 and the emitters of transistors T2, T4, T6 and T8 are connected in parallel to a line 21 through the emitter resistances 17. Lines 20 and 21 are connected to power supply 12.

Power supply 12 comprises a center tapped voltage source indicated as batteries 22 and 23 in series with load resistances 24 and 25 and capacitors 26 and 27. The center point of the voltage source and the junction between capacitors 26 and 27 is connected to ground as shown, and the output is taken between ground and terminal 28.

For purposes of example only, the elements of the disclosed circuit may have the following values and designations:

| | |
|---|---|
| Transistors T1, T3, T5, T7 | 2N4403 |
| Transistors T2, T4, T6, T8 | 2N4401 |
| Resistance 18 | 200 ohms |
| Resistances 17 | 10 ohms |
| Source Impedance 11 | 2-30 ohms |
| Resistances 24, 25 | 200 ohms |
| Capacitors 26, 27 | 1000 micro farads |
| Voltage Sources 22, 23 | 1.5 volts |

Amplifiers as described have been constructed having an equivalent input noise of −147 dbv or less, and a frequency response of −1 dB at 10 hz −1 dB at 100 khz ±2 dB 20 hz − 50 khz and distortion of less than .09% at a 100 millivolt output.

These results are achieved through the combination of the low noise devices in parallel, the use of the emitter resistances to reduce undesirable interactions, and the push-pull arrangement of the transistors to provide distortion cancellation.

Moving coil phono cartridges have a low output impedance and therefore the transistors are selected to have a low base input resistance. The feedback resistance is selected to provide a systems voltage gain of 30 to 100 with an input of .05 to .3 millivolt.

The emitter resistances 17 provide a reduction of undesirable interactions between the elements, and are selected for the smallest value permitting acceptable DC balance.

It may thus be seen that the objects of the invention set forth as well as those made apparent from the foregoing description are efficiently attained. While a preferred embodiment of the invention has been set forth for purposes of disclosure, modification to the disclosed embodiment of the invention as well as other embodiments thereof may occur to those skilled in the art. Accordingly, the appended claims are intended to cover all embodiments which do not depart from the spirit and scope of the invention.

What is claimed is:

1. An amplifier arranged to accept an input signal from a low impedance source such as a moving coil phono cartridge and provide an amplified output signal, comprising, a plurality of first and second transistors, each of said transistors having base, collector and emitter electrodes, and having a low base input resistance, each of said first and second transistors being of complementary types connected in push-pull arrangement with the collectors thereof connected to a common output terminal, an input terminal adapted to receive the output of the cartridge, means connecting said input terminal directly to the base electrodes of each of said first and second transistors with no intermediate resistance, a resistance in the emitter circuit of each transistor, said resistances being of the same value, first means connecting the emitter resistances of each of said first transistors, second means connecting the emitter resistances of each of said second transistors, and means connecting a power source across said first and second means.

2. The amplifier of claim 1 further including a resistance connected between said input and output terminals.

\* \* \* \* \*